(12) United States Patent
Pietambaram et al.

(10) Patent No.: US 10,777,428 B2
(45) Date of Patent: Sep. 15, 2020

(54) VIA INTERCONNECTS IN SUBSTRATE PACKAGES

(71) Applicant: INTEL CORPORATION, Santa Clara, CA (US)

(72) Inventors: Srinivas V. Pietambaram, Gilbert, AZ (US); Rahul N. Manepalli, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/071,826

(22) PCT Filed: Feb. 26, 2016

(86) PCT No.: PCT/US2016/019943
§ 371 (c)(1),
(2) Date: Jul. 20, 2018

(87) PCT Pub. No.: WO2017/146737
PCT Pub. Date: Aug. 31, 2017

(65) Prior Publication Data
US 2019/0019691 A1    Jan. 17, 2019

(51) Int. Cl.
*H01L 21/48* (2006.01)
*H01L 23/498* (2006.01)
*H01L 21/683* (2006.01)

(52) U.S. Cl.
CPC ........ *H01L 21/486* (2013.01); *H01L 21/4857* (2013.01); *H01L 21/6835* (2013.01);
(Continued)

(58) Field of Classification Search
CPC ............... H01L 21/486; H01L 21/4857; H01L 21/6835; H01L 23/49827; H01L 23/49816; H01L 23/49822
(Continued)

(56) References Cited

U.S. PATENT DOCUMENTS 7,294,568 B2 * 11/2007 Goodner ........... H01L 21/76807
257/E21.581
8,399,349 B2 * 3/2013 Vrtis ................. H01L 21/02115
438/619
(Continued)

FOREIGN PATENT DOCUMENTS

WO    2011155638 A1    12/2011

OTHER PUBLICATIONS

International Search Report and Written Opinion, dated Nov. 21, 2016, issued in related International Application No. PCT/US2016/019943, 12 pages.
(Continued)

*Primary Examiner* — Dao H Nguyen
(74) *Attorney, Agent, or Firm* — Schwabe, Williamson & Wyatt, P.C.

(57) ABSTRACT

Embodiments herein may relate to providing, on a pad coupled with a carrier panel, a sacrificial element. Embodiments may further relate to providing, on the pad, a mold compound, wherein the mold compound is at least partially adjacent to the sacrificial element. Embodiments may further relate to removing, subsequent to the providing of the mold compound, the sacrificial element to form a via in the mold compound to at least partially expose the pad. Other embodiments may be described and/or claimed.

13 Claims, 11 Drawing Sheets

(52) U.S. Cl.
CPC .. *H01L 23/49816* (2013.01); *H01L 23/49827* (2013.01); *H01L 2221/68345* (2013.01)

(58) Field of Classification Search
USPC ......... 257/774, 758, 522, E21.564, E21.573, 257/E21.581, E23.144, E23.167; 438/618, 619, 622, 623, 781
See application file for complete search history.

(56) References Cited

U.S. PATENT DOCUMENTS

| | | | |
|---|---|---|---|
| 2003/0224591 A1* | 12/2003 | Latchford | H01L 21/764 438/619 |
| 2004/0102031 A1* | 5/2004 | Kloster | H01L 21/7682 438/619 |
| 2005/0060886 A1 | 3/2005 | Tsukahara et al. | |
| 2008/0217772 A1 | 9/2008 | Watanabe | |
| 2009/0004841 A1* | 1/2009 | Supriya | H01L 21/486 438/618 |
| 2012/0153495 A1 | 6/2012 | Mallik et al. | |
| 2012/0206068 A1* | 8/2012 | Sone | H01L 21/76802 315/362 |
| 2014/0262468 A1 | 9/2014 | Chen et al. | |
| 2018/0090366 A1* | 3/2018 | Deprat | H01L 21/31116 |

OTHER PUBLICATIONS

Extended European Search Report dated Nov. 4, 2019 for EP Application No. 16891846.4, 9 pages.

\* cited by examiner

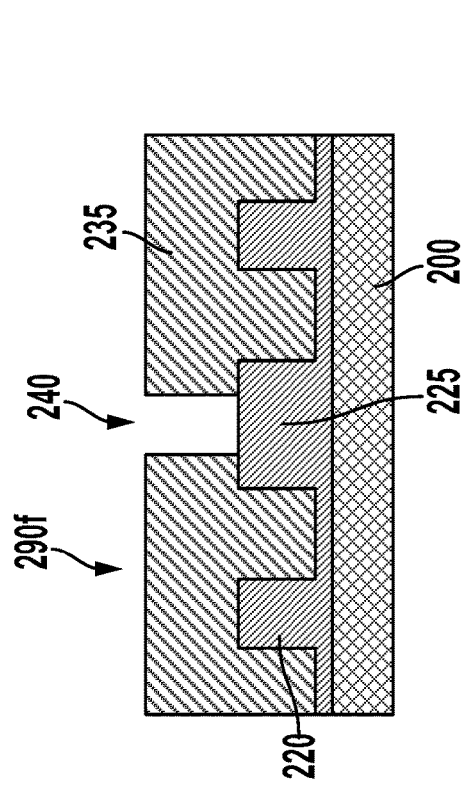
Figure 6
Figure 7
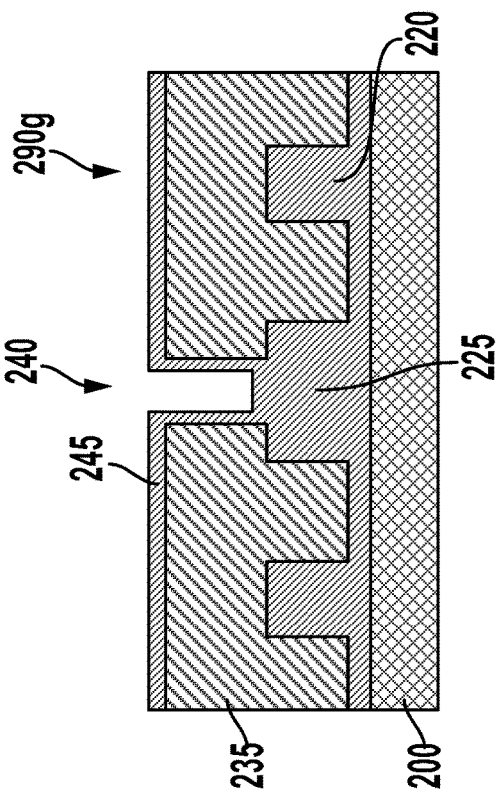
Figure 8
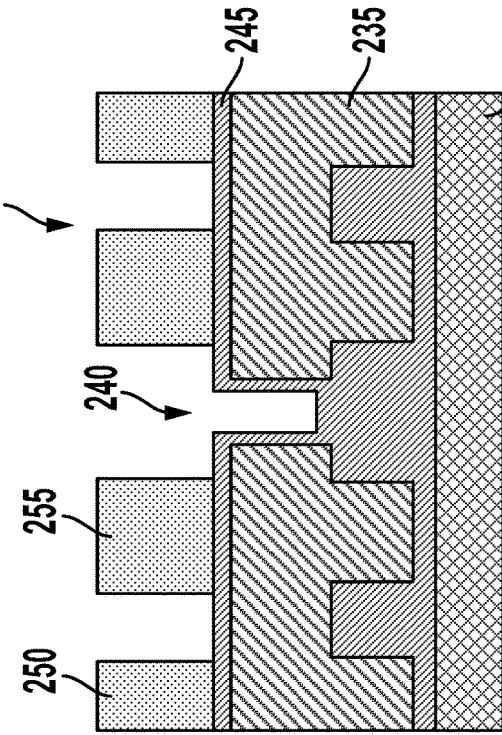
Figure 9

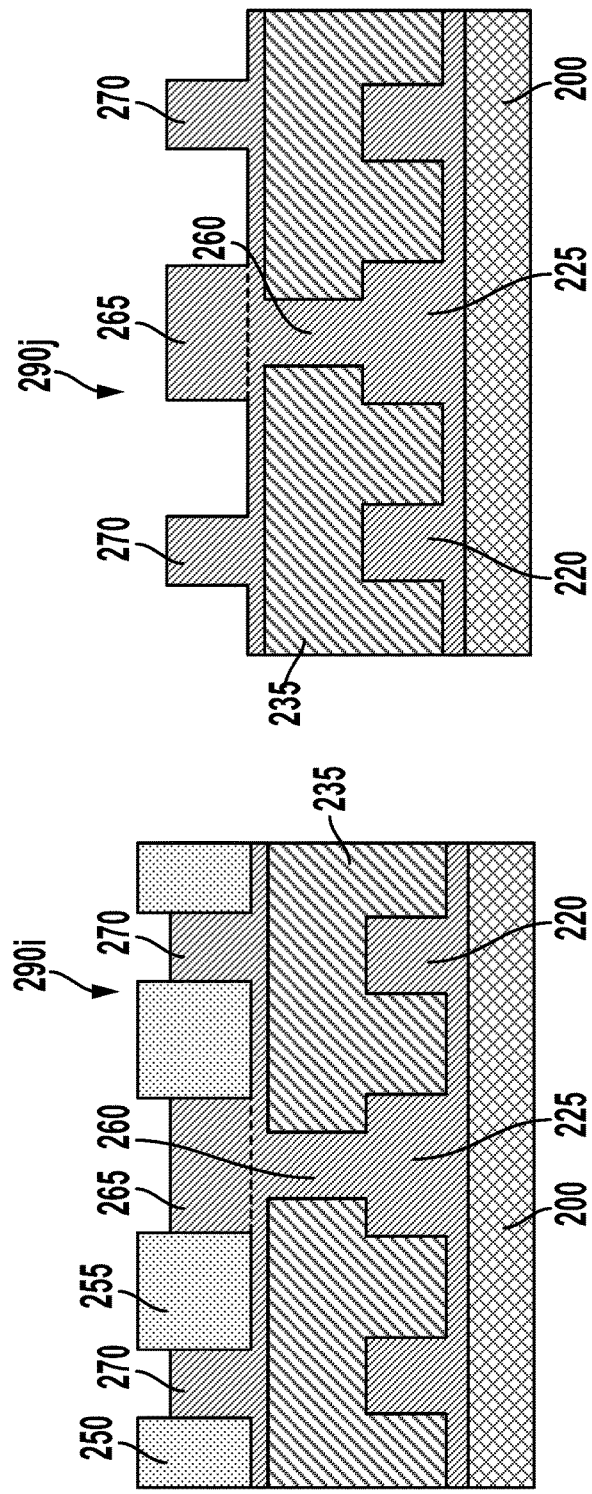
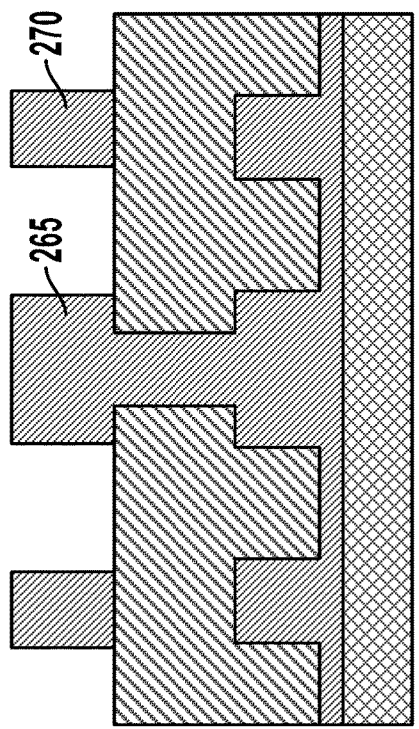

VIA INTERCONNECTS IN SUBSTRATE PACKAGES

CROSS REFERENCE TO RELATED APPLICATIONS

The present application is a national phase entry under 35 U.S.C. § 371 of International Application No. PCT/US2016/019943, filed Feb. 26, 2016, entitled "VIA INTERCONNECTS IN SUBSTRATE PACKAGES," which designates the United States of America, the entire disclosure of which is hereby incorporated by reference in its entirety and for all purposes.

TECHNICAL FIELD

The present disclosure relates generally to the field of micro-vias, and more specifically to micro-vias in integrated circuit (IC) substrate packages. Specifically, this disclosure relates to micro-vias in molded packages such as Molded Interconnect System—Ball Grid Array (MIS-BGA) packages.

BACKGROUND

MIS-BGA packaging architecture may be attractive for two factors. First, MIS-BGA architecture may have a relatively low profile (otherwise referred to as "z-height"). Additionally, MIS-BGA architecture may be a relatively low cost architecture as compared to architectures that use Prepreg or Ajinomoto Build-up Film (ABF) because MIS-BGA architecture may not require laser drilling and may use a low cost mold compound rather than the Prepreg or ABF materials.

In some legacy MIS-BGA packages, the process of manufacturing the MIS-BGA package may have included depositing a dry film resist (DFR) to serve as a mask, forming traces and/or pads on a substrate, and then removing the DFR. Subsequently, the process may have included at least partially covering the traces and/or pads with a second layer of dry film resist (DFR), for example, through lamination or some other process. A via may have then been litho-defined through the DFR to the pad to at least partially expose the pad, and then copper may have been plated in the opening to form a plated copper via. Subsequent to this plating, the DFR may have been stripped and a mold compound may have been formed on the pads, traces, and copper via, which would then have to be ground and/or treated so that the surface of the mold was flush with the surface of the via for the subsequent layer formation.

While this technique may offer some cost advantages over ABF-based high density interconnection (HDI) substrate processing, the above described process may use two litho-defined steps, one to create an underlying pad and the $2^{nd}$ to create the via metal. Further, this process may limit the ability to create fine line and spacing (FLS) of copper traces, especially in all layers of the package. For example, it may be difficult to mass produce traces with a width of less than 15 microns and/or that are spaced less than 15 microns apart from one another (referred to herein as 15/15 L/S), since grinding of dielectric material of the package may be necessary to expose an embedded via inside of a mold compound of the package. Additionally, the above described grinding or surface treatment process may negatively impact reliability or structural stability of the MIS-BGA package.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 6 is another stage of an example process for manufacturing an MIS-BGA package, in accordance with various embodiments.

FIG. 7 is another stage of an example process for manufacturing an MIS-BGA package, in accordance with various embodiments.

FIG. 8 is another stage of an example process for manufacturing an MIS-BGA package, in accordance with various embodiments.

FIG. 9 is another stage of an example process for manufacturing an MIS-BOA package, in accordance with various embodiments.

FIG. 10 is another stage of an example process for manufacturing an MIS-BGA package, in accordance with various embodiments.

FIG. 11 is another stage of an example process for manufacturing an MIS-BGA package, in accordance with various embodiments.

FIG. 12 is another stage of an example process for manufacturing an MIS-BGA package, in accordance with various embodiments.

DETAILED DESCRIPTION

Figure 1:
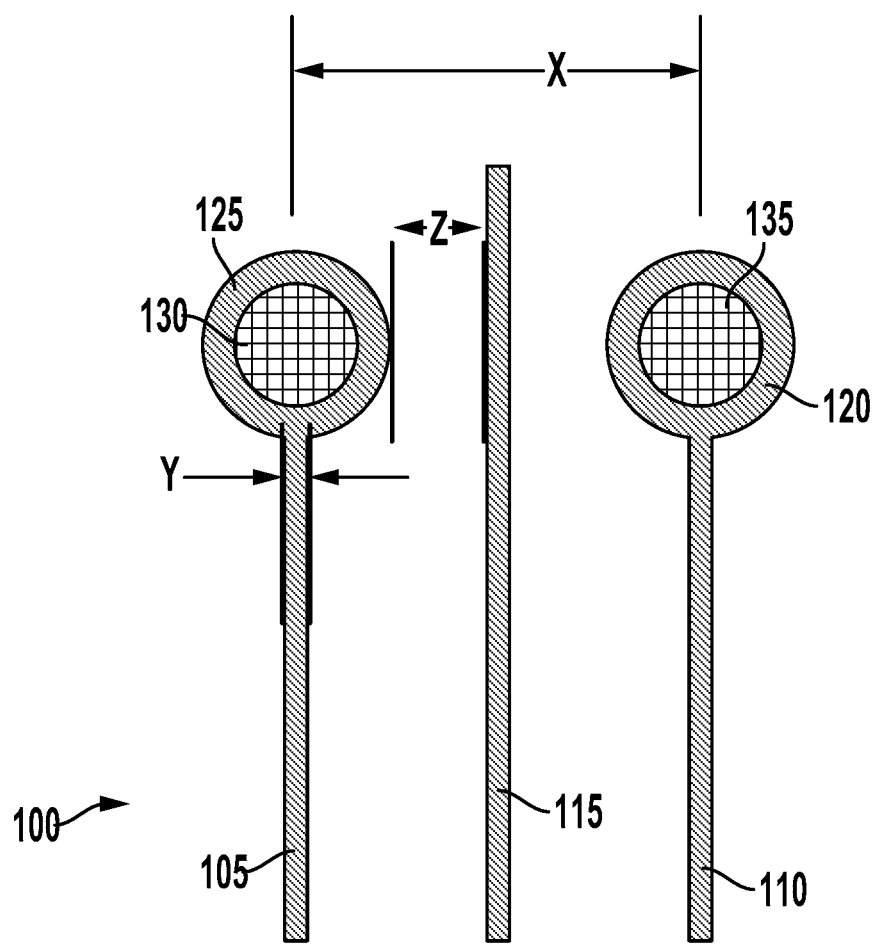
FIG. 1 is a top-down example of pads, traces, and vias, in accordance with various embodiments.

Embodiments herein may relate to an MIS-BGA package that has an FLS of less than 15/15 L/S. Generally, such a package may be the result of a manufacturing technique that includes the formation of one or more pads and/or traces on a substrate. A sacrificial element may be provided on at least one of the pads. A mold compound may be compression molded onto the package such that the face of the sacrificial element is generally flush with the face of the mold compound. The package may then be thermally treated such that the sacrificial element cleanly decomposes to gas to form a via.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first layer formed on a second layer" may mean that the first layer is formed over the second layer, and at least a part of the first layer may be in direct contact (e.g., direct physical and/or electrical contact) or indirect contact (e.g., having one or more other layers between the first layer and the second layer) with at least a part of the second layer.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

FIG. 1 is a top-down example of pads, traces, and vias, in accordance with various embodiments. Specifically, FIG. 1 depicts a top-down view of one layer of a package 100. The package 100 may include a plurality of traces such as traces 105, 110, and 115. In embodiments, the traces 105/110/115 may be copper, while in other embodiments the traces may be some other electrically and/or thermally conductive material.

In embodiments, some of the traces such as traces 105 and 110 may be coupled with a pad such as 120 and 125. In embodiments, the pads 120/125 may be constructed of a same or similar materials as the traces 105/110/115. For example, the pads 120/125 may be constructed of copper. In other embodiments the pads 120/125 may be constructed of a different material than the traces 105/110/115, for example, some other electrically and/or thermally conductive material.

As shown in FIG. 1, in embodiments the pads 120/125 may have a larger footprint than the traces 105/110/115, as will be discussed below. As discussed herein, footprint may generally refer to the lateral size of the element. Similarly, it can be seen that not all traces may be directly coupled with a pad. For example, trace 115 may not be coupled with a pad.

In some embodiments, the pads 120/125 may be coupled with one or more conductive vias such as vias 130 and 135. As shown in FIG. 1, in embodiments the vias 130/135 may have a smaller footprint than the pads 120/125. That is, the vias 130/135 may have a smaller diameter than the pads 120/125. The smaller diameter of the vias may be to provide a small margin of error during manufacturing such that if the via is not placed directly on the center of the pad, the via may not extend beyond the perimeter of the pad.

As shown in FIG. 1, the package 100 may include a variety of measurements that may be referred to herein. For example, the distance between the center of the pads 120 and 125 may be a value depicted in FIG. 1 as "X." Similarly, the traces 105/110/115 may have a width depicted in FIG. 1 as "Y." Finally, the distance between the pads 120/125 and the trace 115 may be a value depicted in FIG. 1 as "Z." Generally, the values for X, Y, and Z may be given on the order of microns. It will be understood that although the traces 105/110/115 are depicted as generally linear, and the pads 120/125 and vias 130/135 are depicted as generally circular, in other embodiments the traces, pads, and/or vias may have a different shape.

As discussed above, in legacy MIS-BGA packages, the values for Y and Z may be 15 microns, respectively, giving an FLS of 15/15 L/S. However, embodiments herein may have smaller values for Y and/or Z, which in turn may allow the value of X to decrease. For example, various embodiments may have a value for Y and/or Z on the order of approximately 10 microns or less.

Being able to achieve these smaller values for X, Y, and/or Z may provide significant benefits. For example, as performance demands on the MIS-BGA packages increase, it may be useful to provide more input/output (I/O) ports. However, with legacy MIS-BGA packages, the way to achieve these increased ports may be to add more layers to a package so that the number of traces and/or pads may be increased. However, adding more layers to a package may increase the cost and/or z-height of a package, which may be undesirable based on space and/or sales considerations. However, embodiments herein that allow for a smaller FLS may allow for more traces and/or pads to be placed in a layer of a package, thereby allowing an increased number of I/O ports without increasing cost and/or z-height.

FIGS. 2-12 depicts various stages of manufacturing a package such as package 100, in accordance with various embodiments. Similar elements are numbered similarly through FIGS. 2-12, and every element of a given Figure may not be referred to herein with respect to each Figure for the sake of clarity and ease of explanation.

Figure 2:
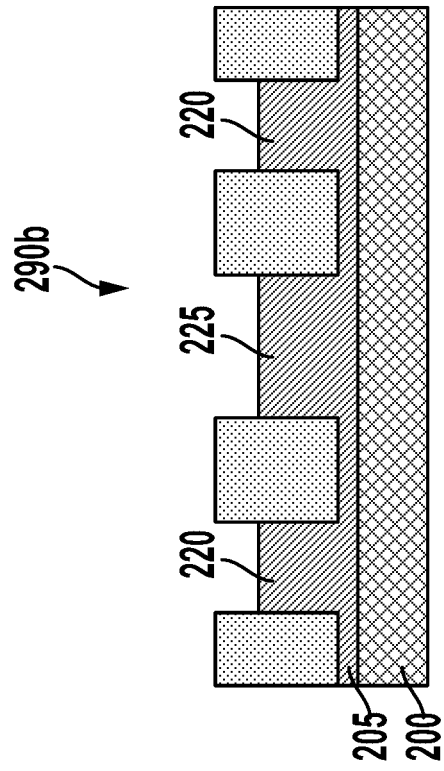
FIG. 2 is a stage of an example process for manufacturing an MIS-BGA package, in accordance with various embodiments.

Initially, as shown in FIG. 2, the package 290a may include a carrier panel 200 that may be referred to as a "peelable core". This carrier panel 200 may have different configurations in various embodiments.

In some embodiments, the carrier panel may include two copper layers that are separated by a weak layer that may allow for separation of a manufactured MIS-BGA substrate from the carrier. In the foregoing manner, at the end of the process a copper etch process may be used to remove the sacrificial copper layer, i.e. the copper layer that remains attached to the manufactured MIS-BGA substrate subsequent to separation of the substrate from the carrier. However, other embodiments may include two dielectric layers, or a dielectric layer and a copper layer to allow for peeling. In embodiments where the sacrificial material after peel is a dielectric material, a removal process such as wet-blast or some other removal process may be used to remove this dielectric material instead of the above-described copper etch process.

Initially, a seed layer 205 may be provided on the carrier panel 200. The seed layer 205 may be copper or some other electrically and/or thermally conductive material. Dry film resist (DFR) portions 210/215 may then be provided on the seed layer 205. In some embodiments, the DFR portions 210/215 may be laminated, deposited, etched, and/or formed according to some other process. In some embodiments, the DFR portions 210/215 may be laminated onto the seed layer, then masked and photo-defined.

Figure 3:
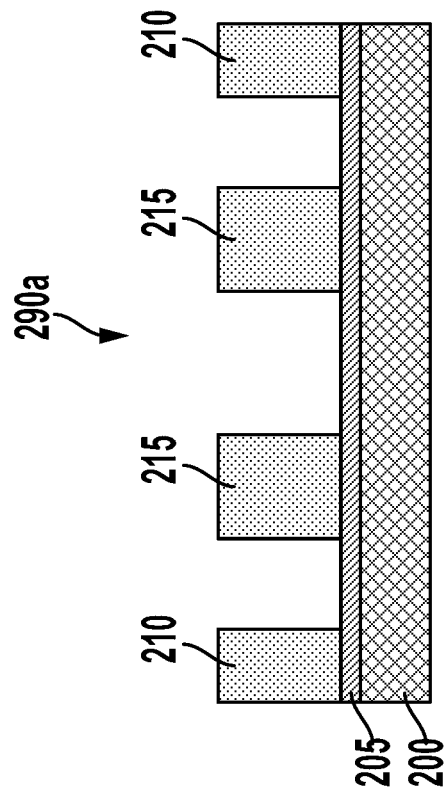
FIG. 3 is another stage of an example process for manufacturing an MIS-BGA package, in accordance with various embodiments.

Next, as shown in FIG. 3, one or more pads such as pad 225 and one or more traces such as traces 220 may be formed on the package 290b. The pad 225 may be similar to pads 120 and 125, and the traces 220 may be similar to traces 105/110/115. In embodiments, the pad 225 and/or traces 220 may be formed via a plating process such as elytic plating. In embodiments the pad 225 and/or traces 220 may be formed of copper and/or some other electrically and/or thermally conductive material. In embodiments, the pad 225 and/or traces 220 may be formed of the same material or a different material than the seed layer 205. Although the pad 225 and the traces 220 are shown as having roughly the same z-height in FIG. 3, in other embodiments the pad 225 and one or more of the traces 220, or the two traces 220, may have different z-heights than one another.

Figure 4:
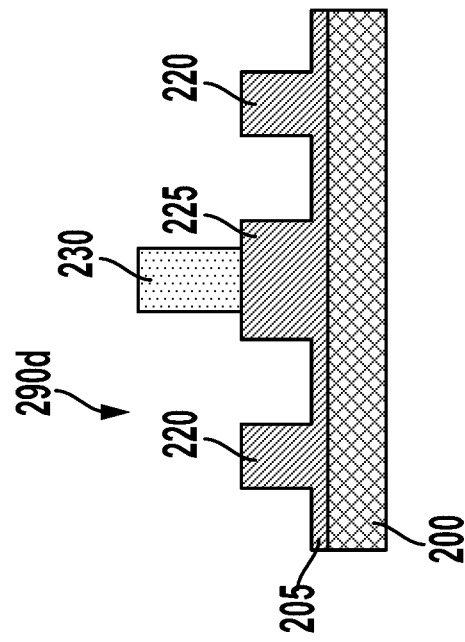
FIG. 4 is another stage of an example process for manufacturing an MIS-BGA package, in accordance with various embodiments.

Next, as shown in FIG. 4, the DFR portions 210/215 may be exposed and developed from the package 290c to expose the pad 225 and the traces 220. In embodiments, DFR portions 210/215 may be removed via various techniques such as etching, chemical removal, photo removal, drilling, or some other technique.

Figure 5:
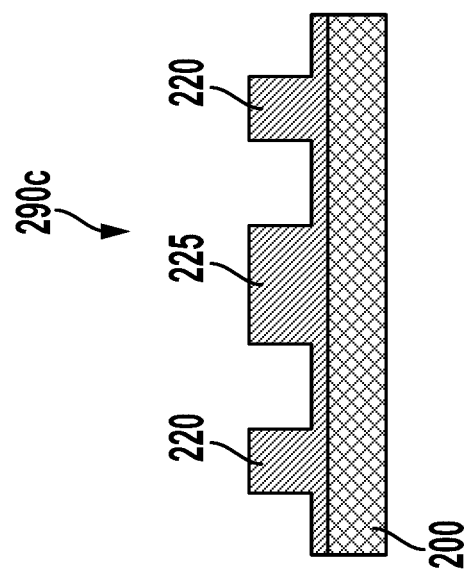
FIG. 5 is another stage of an example process for manufacturing an MIS-BGA package, in accordance with various embodiments.

Subsequently, as shown in FIG. 5, a sacrificial element 230 may be formed on the pad 225 of package 290d. In embodiments, the sacrificial element 230 may be shaped similarly to that of a via that is to be formed on pad 225. For example, the sacrificial element 230 may have a shape similar to that of vias 130/135. In embodiments, the sacrificial element 230 may be formed of Polynorbornene and/or a poly carbonate based polymer. Generally, the sacrificial element 230 may be a material that decomposes to a gas when exposed to a relatively high temperature. Such a temperature may be at or above 180° Celsius (C) in some embodiments. In other embodiments, the temperature may be at or above 200° C. Generally, the temperature may be based on considerations such as thermal requirements of other elements of the package, manufacturing processes for the package, or some other consideration.

The sacrificial element 230 may be provided on the pad 225 via stencil printing in embodiments that are related to low cost applications where there may be a margin for alignment of a via to the pad 225. The sacrificial element 230 may be curtain coated, photo exposed, and developed in embodiments where very precise via to pad alignment is desired. In other embodiments the sacrificial element 230 may be provided on the pad according to one or more other processes or techniques.

Next, a mold compound 235 may be provided on the package 290e via compression molding as shown in FIG. 6. The mold material used for the mold compound 235 may be an epoxy mold compound (EMC). In embodiments, the formulation of the EMC may be chosen as desired for a specific targeted application. In embodiments, compression molding may refer to providing the mold compound on the package 290e, and then compressing the package 290e in one or more directions. For example, as discussed below, in one embodiment the package 290e may be compressed at least by application of force to both the top and bottom (as depicted in FIG. 6) of the package 290e. Compression molding is described in further detail below.

An advantage to compression molding may be that doing so may allow the surface of the mold compound 235 to be generally flush with the sacrificial element 230, thereby reducing or eliminating the need for grinding of the mold compound 235 to expose the sacrificial element 230. Reducing or eliminating the need for grinding may lower the cost and manufacturing complexity of the overall package.

As shown in FIG. 7 with respect to package 290f, the sacrificial element 230 may be thermally decomposed as described above (e.g., by application of heat) to a gas, leaving via 240. For example, as described above, the thermal decomposition may include application of heat at or above 180° C. In other embodiments, the thermal decomposition may include application of heat at or above 200° C. In some embodiments, an additional cleaning step may be necessary to remove remnants of the sacrificial element 230 from the via 240. In other embodiments, the sacrificial element 230 may fully decompose so the additional cleaning step may be un-necessary. In embodiments, the thermal decomposition may be the result of application of a directed heat source, while in other embodiments the thermal decomposition may be the result of generally heating the package 290e.

Subsequently, as shown in FIG. 8, an additional seed layer 245, which may be similar to seed layer 205, may be applied to the package 290g. In embodiments, the seed layer 245 may be formed of the same material as seed layer 205, traces 220, and/or pad 225. In other embodiments, the seed layer 245 may be formed of a different electrical and/or thermally conductive material.

As shown in FIG. 9, additional DFR portions 250 and 255 may be formed on the package 290h. The DFR portions 250 and 255 may be similar to DFR portions 210 and/or 215. In embodiments, the DFR portions 250 and 255 may be formed via lamination, masking with a photoresist material, and then photo exposure and development. In other embodiments, the DFR portions 250 and 255 may be formed via one or more different processes and/or techniques as described above with respect to DFR portions 210 and/or 215.

Next, as shown in FIG. 10, one or more pads such as pad 265 and one or more traces such as traces 270 may be formed on the package 290i. Similarly, the via 260 may be filled such that pad 265 and pad 225 are electrically and/or thermally coupled with one another by way of via 260.

The pad 265 may be similar to pad 225 or pads 120 and 125, and the traces 270 may be similar to traces 220 or traces 105/110/115. In embodiments, the pad 265, via 260, and/or traces 270 may be formed via a plating process such as elytic plating. In embodiments the pad 265, via 260, and/or traces 270 may be formed of copper and/or some other electrically and/or thermally conductive material. In embodiments, the pad 265, via 260, and/or traces 270 may be formed of the same material or a different material than the seed layer 245. Although the pad 265 and the traces 270 are shown as having roughly the same z-height in FIG. 3, in other embodiments the pad 265 and one or more of the traces 270, or the two traces 270, may have different z-heights than one another.

Next, as shown in FIG. 11, the DFR portions 250/255 may be stripped from the package 290*j* to expose the pad 265 and the traces 270. As described above, the DFR portions 250/255 may be removed via various techniques such as etching, chemical removal, photo removal, drilling, or some other technique. Subsequently, as shown in FIG. 12, the seed layer 245 may be at least partially removed from the package 290*k* such that the pad 265 and/or one or more of the traces 270 are electrically and/or thermally isolated from one another. Subsequently, further techniques such as those shown and discussed with respect to FIGS. 6-12 may be performed to add additional layers to the package 290*k*. The number of iterations of adding a layer to a package may be based on various factors such as desired use, z-height specifications, the number of I/O ports necessary, or the lateral footprint of the package.

Once the desired number of layers are formed, the package 290*k* may be released from the carrier panel 200 at the Peelable interface of the Peelable core, followed by copper etch. Desired surface finish on the pads may then be performed, followed by bumping to finish the final package.

Figure 13:
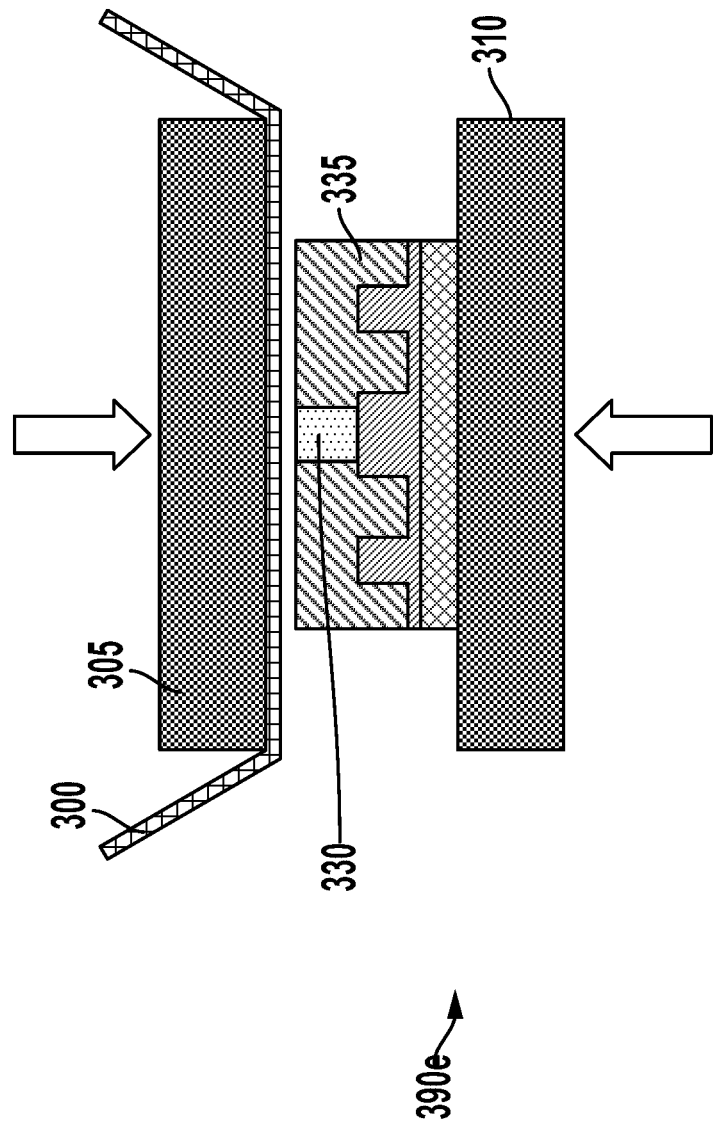
FIG. 13 depicts an example of a compression technique that may be used in the manufacturing of an MIS-BGA package, in accordance with various embodiments.

FIG. 13 depicts an example of compression molding such as that discussed above with respect to FIG. 6. Specifically, FIG. 13 depicts a package 390*e* that may be similar to package 290*e*. The package 390*e* may be positioned between at least a top plate 305 and a bottom plate 310 of a mold chase. Release tape 300 may be positioned between the top plate 305 and the package 390*e*. As discussed above, the mold compound 335, which may be similar to mold compound 235, may be provided on the package 390*e*. The package 390*e* may then be compressed between the top and bottom plates 305/310 and the mold compound 335 may then be cured or otherwise hardened while the package 390*e* is being compressed.

This compression may cause the surface of the mold compound 335 to be generally flush with the surface of the sacrificial element 330 when the package 390*e* is removed from between the mold plates 305/310. In some embodiments, the compression molding process may also ensure that the sacrificial element 330 remains relatively still during the curing of the mold, thereby forming a good profile for a resultant via such as via 240/260.

Figure 14:
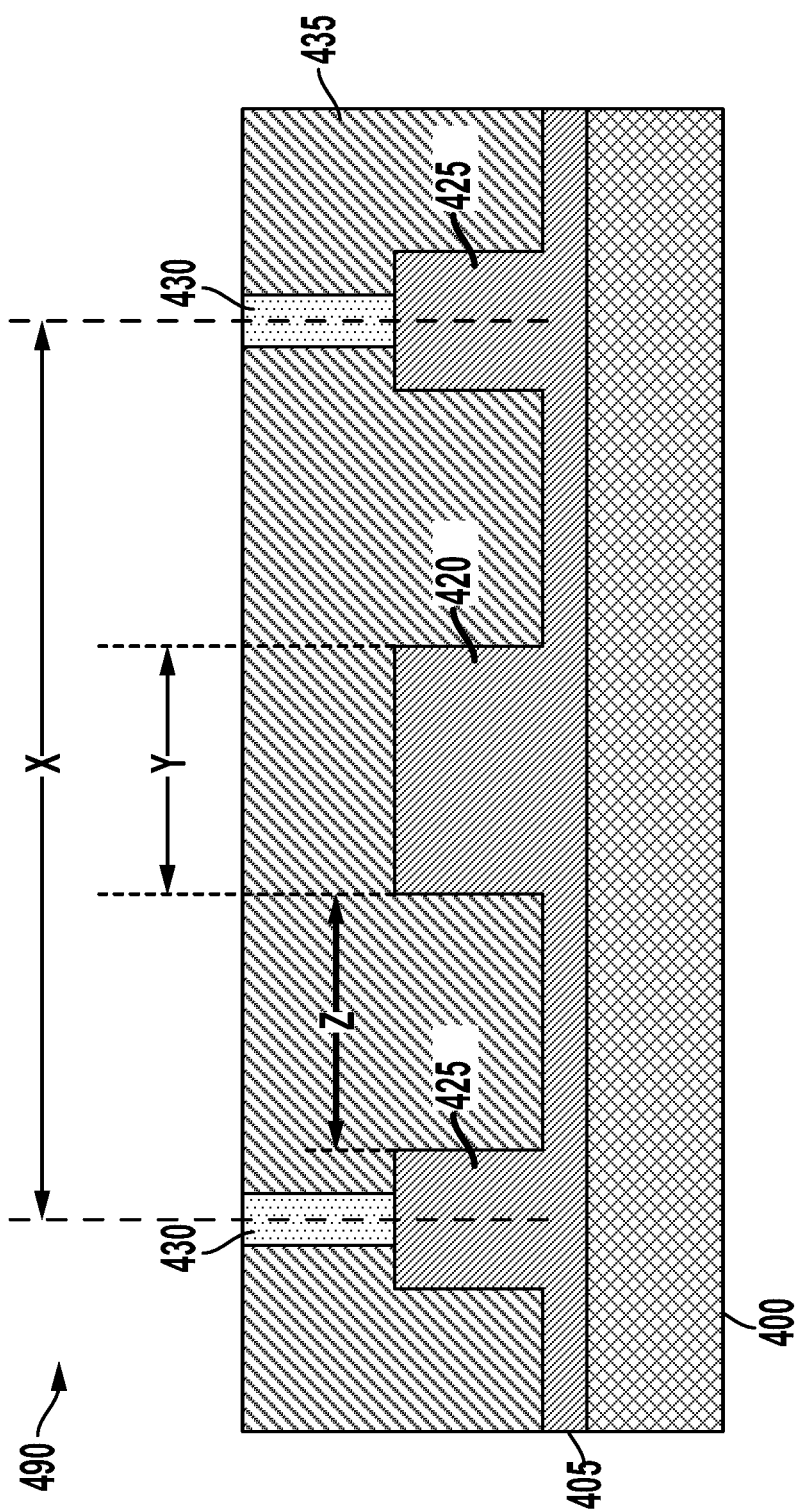
FIG. 14 depicts an alternate example structure of an MIS-BGA package, in accordance with various embodiments.

FIG. 14 depicts an alternate example structure of an MIS-BGA package 490, in accordance with various embodiments. The package 490 may include a carrier panel 400 and seed layer 405, which may be respectively similar to carrier panel 200 and seed layer 205. The package 490 may further include a trace 420 and pads 425, which may be respectively similar to trace(s) 220 and pad 225. The package 490 may include a sacrificial element 430, which may be similar to sacrificial element 230, disposed on the pads 425. The package 490 may further include a mold compound 435, which may be similar to mold compound 235.

As discussed with reference to FIG. 1, the distance between the centers of the two pads 425 may be denoted herein as "X." The width of the trace 420 may be denoted as "Y." The distance between two elements, for example, pad 425 and trace 420, may be denoted as "Z."

As discussed above, in legacy MIS-BGA packages, the pad to via alignment tolerances in litho processes may require that any pad onto which a via is patterned has to be larger than the tolerance of alignment of the patterning process to ensure that the entire via lands on the pad. As a result large pads may be required, however the use of such large pads may limit the number of traces that can be routed on any given layer, thereby preventing the use of FLS interconnect layers. Consequently, depending on the alignment capability of litho process, the number of FLS traces may be inherently limited in traditional MIS-BGA packages.

However, in embodiments described herein, a high precision inkjet printer may be used to place the sacrificial element similar to 230 and/or 430 precisely at the desired location using unit level alignment, thereby resulting in a tighter via to pad tolerance. This tighter tolerance may enable a smaller value of X as described herein. As a result, the underlying pad size may then be significantly reduced to enable FLS interconnects.

In other embodiments, sacrificial element similar to 230 and/or 430 can be curtain coated, photo exposed, and developed, which may result in a tighter via to pad tolerance than was available in legacy packages. Further since the current embodiment may not require grinding of the mold compound to expose the via metal, the surface of the mold compound may not be inherently damaged—thereby enabling significantly higher reliability and ability to pattern finer lines and spaces. Similarly, because multiple DFR stripping techniques may not be necessary for each layer, the overall cost and manufacturing complexity of the package may be reduced.

Figure 15:
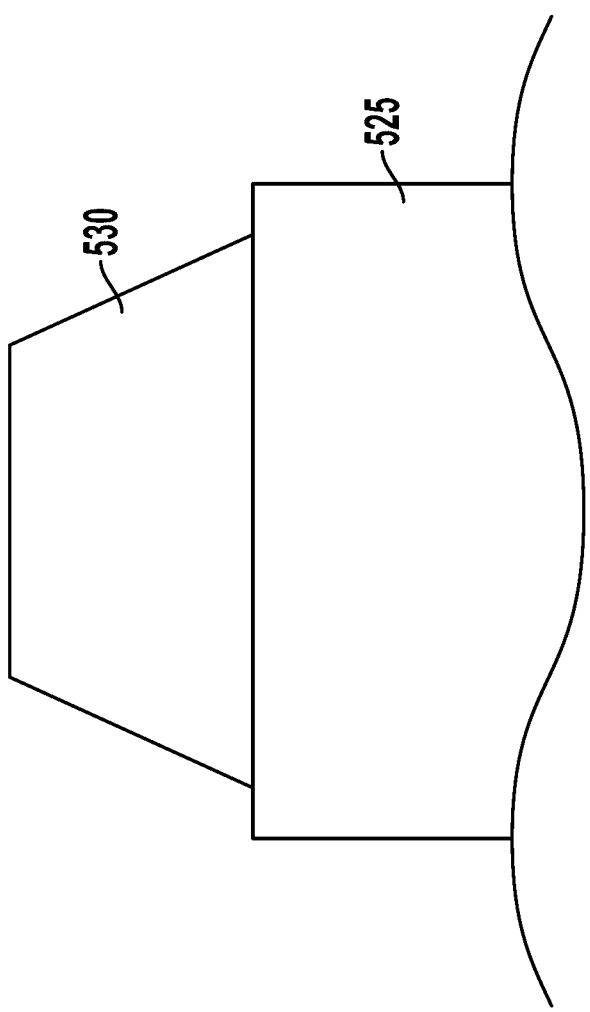
FIG. 15 depicts an example of one arrangement of a sacrificial element and a pad, in accordance with various embodiments.

FIG. 15 depicts an example of one arrangement of a sacrificial element 530 and a pad 525, in accordance with various embodiments. The sacrificial element 530 may be similar to sacrificial element 230 and/or 430. The pad 525 may be similar to pad 425 and/or 225.

In embodiments, the sacrificial element 530 may have walls that are entirely vertical. However, in other embodiments as shown in FIG. 15, the walls of the sacrificial element 530 may be at least partially slanted such that the sacrificial element 530 tapers from the pad 525 to the face of the sacrificial element that is farthest from the pad 525. The sacrificial element 530 of FIG. 15 is one such example of a tapered sacrificial element. The amount of tapering, if any, may be defined by process optimization. For example, if the sacrificial element 530 is stencil printed and/or photo-defined, then the resultant sacrificial element 530 may not be tapered at all.

Figure 16:
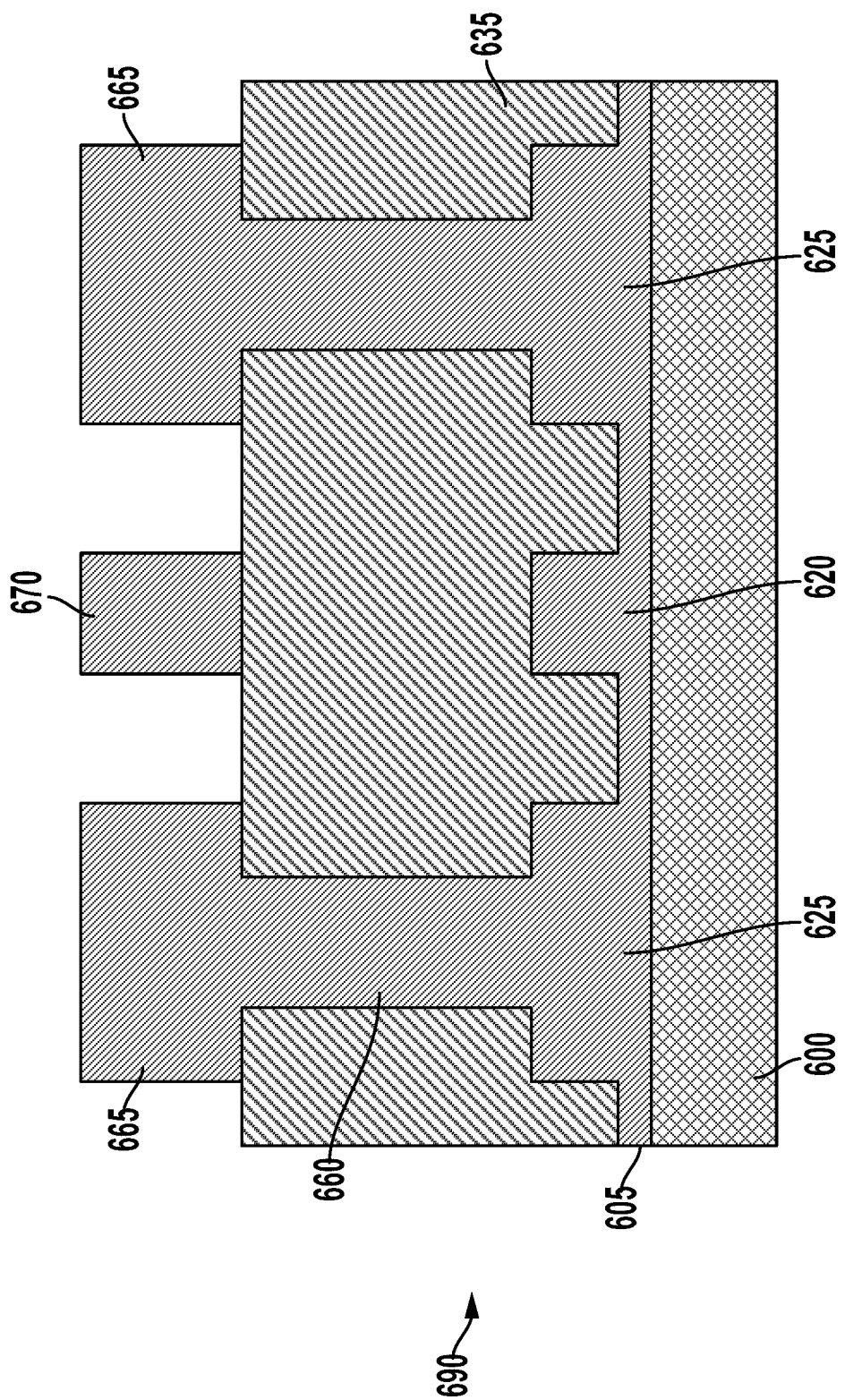
FIG. 16 depicts an alternate example structure of an MIS-BGA package, in accordance with various embodiments.

FIG. 16 depicts an alternate example structure of an MIS-BGA package 690, in accordance with various embodiments. The package 690 may include a substrate 600, a seed layer 605, one or more pads 625, and a trace 620, which may be respectively similar to substrate 400, seed layer 405, pads 425, and/or trace 420. Package 690 may further include a mold compound 635, which may be similar to mold compound 435. Package 690 may further include one or more pads 665 and a trace 670, which may be respectively similar to pad 265 and traces 270. In some embodiments, the package 690 may include one or more plated vias 660, which may be similar to via 260.

Figure 17:
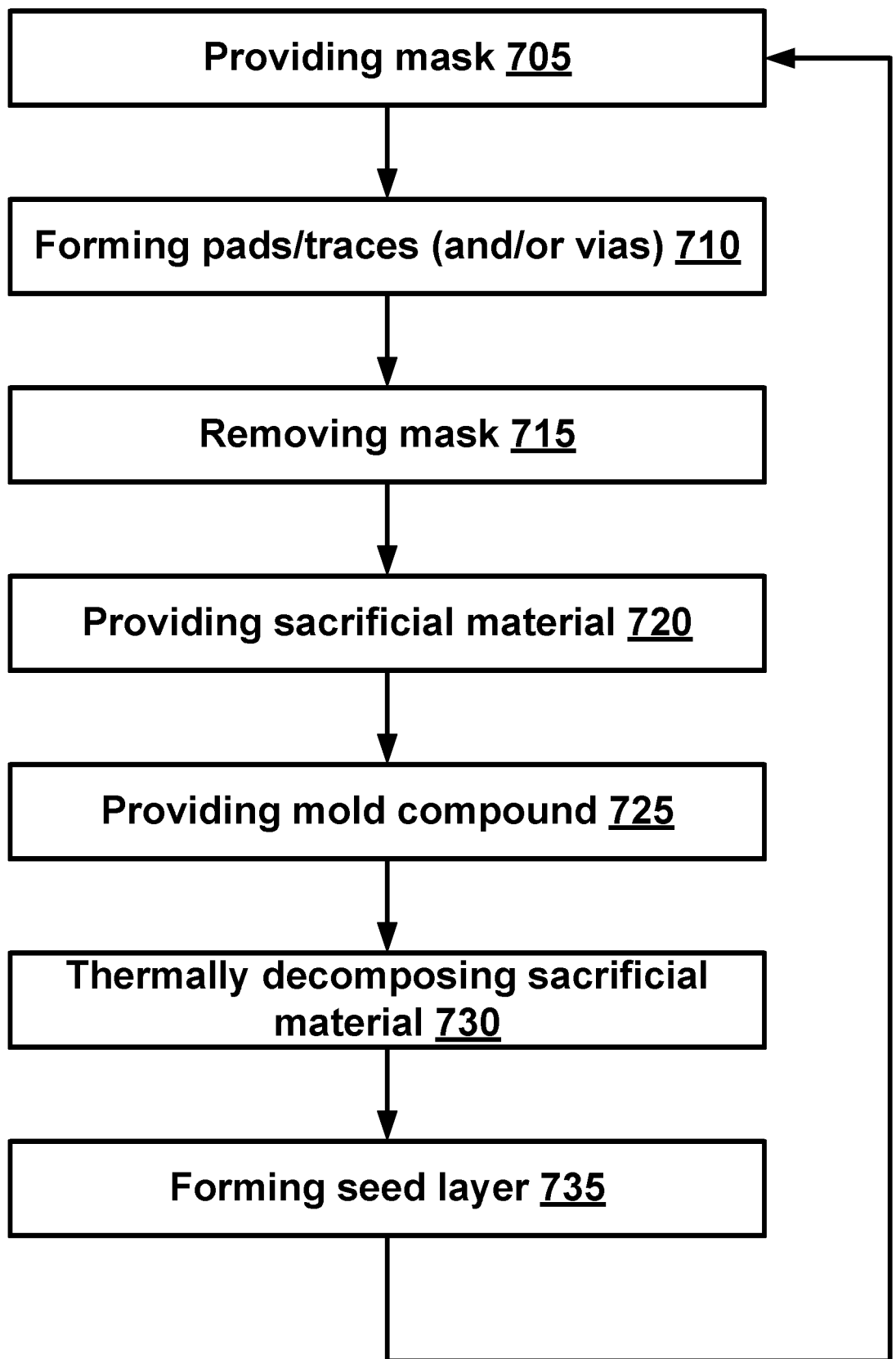
FIG. 17 depicts an example process flow for manufacturing an MIS-BGA package, in accordance with various embodiments.

FIG. 17 depicts an example process flow for generating an MIS-BGA package such as MIS-BGA packages 290*k*, 490, and/or 690. Specifically, FIG. 17 may relate to an iterative process for generating a plurality of layers of a package. Generally, the process flow of FIG. 17 will be described with reference to the packages depicted in FIGS. 2-12.

Initially, a mask may be provided on a substrate at 705. The mask may include DFR portions such as DFR portions 210 or 215 that are included on seed layer 205 and/or carrier panel 200.

Next, pads and/or traces such as pad 225 and traces 220 may be formed at 710. In iterations, vias such as via 260 may additionally be formed at 710. The pad(s), trace(s), and/or via(s) may be formed via a plating process as described above.

Subsequently, the mask may be removed at 715. For example, DFR portions 210 and/or 215 may be removed as shown with respect to package 290c in FIG. 4.

Next, sacrificial element such as sacrificial element 230 may be provided at 720, as described above.

A mold compound such as mold compound 235 may be provided at 725. The mold compound may be compression molded to the package as described above. Subsequently, the sacrificial element may be thermally decomposed at 730 as described above. Such thermal decomposition may result in the formation of a via such as via 240.

A seed layer such as seed layer 245 may then be formed on the package at 735, and then the process may iterate. A mask such as DFR portions 250 and 255 may be provided at 705, and then further pads, traces, and/or vias such as pad 265, traces 270, and via 260 may be formed at 710, and the DFR portions 250 and 255 may be removed at 715.

The above described process may continue to iterate to generate further layers of a package. In other embodiments, the process may end with the removal of the DFR portions 250 and 255. In some embodiments, a seed layer such as seed layer 205 and/or 245 may be removed subsequent to removing the mask at 715. In some embodiments, pads and/or traces such as pad 265 and traces 270 may not be formed, and the process may end with the formation of the plated via 260 and removal of the mask at 715.

Figure 19:
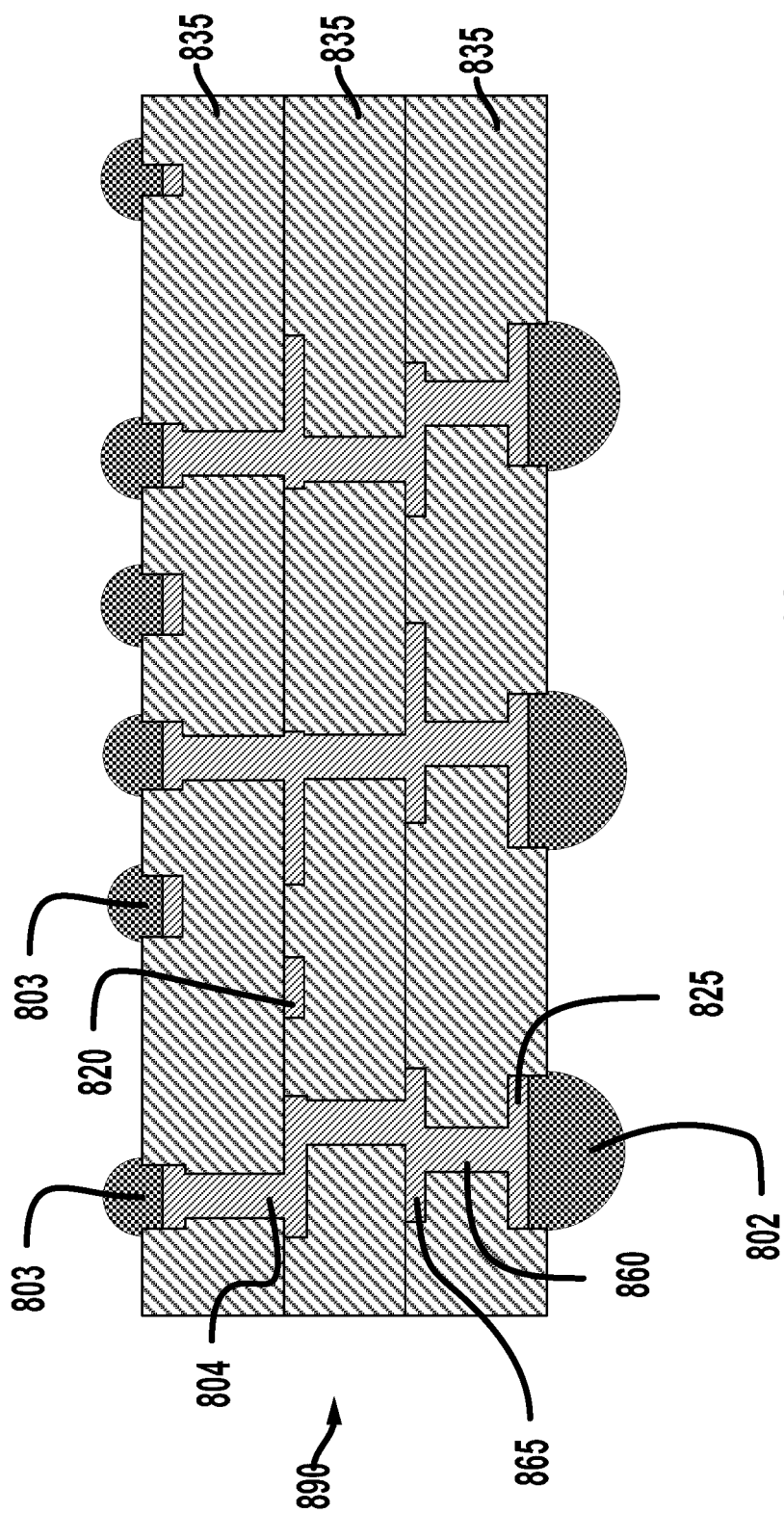
FIG. 19 depicts an example MIS-BGA package, in accordance with various embodiments.

As discussed above, once the desired number of layers are formed, the package may be released from the carrier panel at the Peelable interface of the Peelable core, followed by copper etch. Desired surface finish on the pads may then be performed, followed by bumping to finish the final package. FIG. 19 depicts one example of a 3-layer MIS-BGA package 890. It will be noted that not every element of FIG. 19 is labeled for the sake of clarity and legibility of the Figure, however where one element such as a contact 802 is described, it will be recognized that FIG. 19 may depict three such contacts 802.

The package 890 may include three layers of a mold compound 835, which may be similar to mold compound 235. The package 890 may have a series of contacts 803 and 802 on opposite sides of the package 890. In embodiments, the contacts 803 and 802 may be formed of solder which may include tin, lead, silver, copper, alloys thereof, or some other material. As shown in FIG. 19, in some embodiments the contacts 802 may be larger than the contacts 803 (or vice-versa in other embodiments). Additionally, in some embodiments the contacts 802 and 803 may have a different pitch than one another. The different pitches may be due to a desired use of the package 890 as an interposer or some similar use. In other embodiments the contacts 802 and 803 may be the same size as one another, or have an identical pitch.

The package 890 may include one or more interconnects 804 that may extend through one or more of the three layers of mold compound 835 of the package. The interconnects may include, for example, a series of pads such as pads 825 or 865, which may be electrically and/or thermally coupled by via 860. Pads 825 and 865 and via 860 may be respectively similar to pads 225 and 265, and via 260. In some embodiments the package 890 may further include one or more traces such as trace 820, which may be similar to trace 220.

The interconnects such as interconnect 804 may electrically and/or thermally couple one or more of contacts 803 to one or more of contacts 802 through a series of pads and traces such as those described herein. Although a total of nine contacts 802/803 and three interconnects 804 are depicted in FIG. 19, other embodiments may have more or less contacts or interconnects. Additionally, other embodiments may have more or less layers of mold compound 835.

Generally, it will be understood that the specific configuration of pads and traces, including their number and relative position with respect to one another, is merely intended as one example. In other embodiments, a pad such as pad 225 may be directly coupled with a trace such as trace 270 by way of plated via 260.

Figure 18:
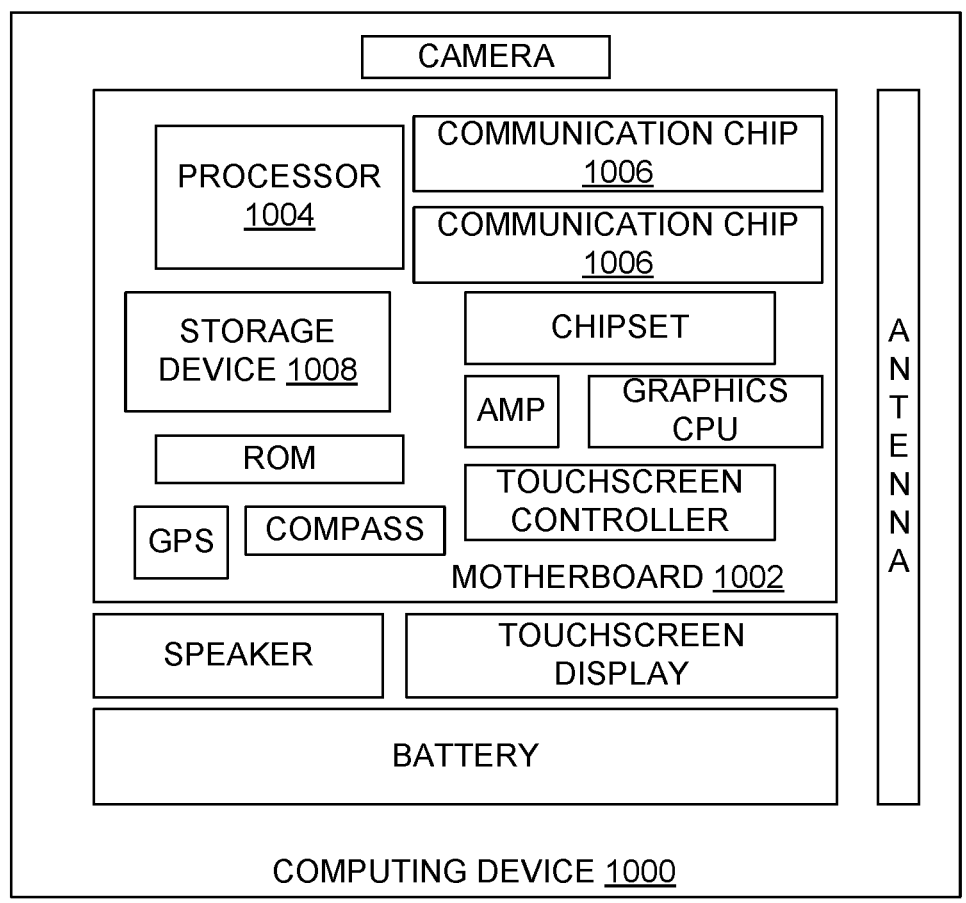
FIG. 18 is an example computing device that may include an MIS-BGA package, in accordance with various embodiments.

Embodiments of the present disclosure may be implemented into a system using any MIS-BGA packages that may benefit from the various manufacturing techniques disclosed herein. FIG. 18 schematically illustrates a computing device 1000, in accordance with some implementations, which may include one or more MIS-BGA packages such as packages 290k, 490, and/or 690. For example, various elements such as processor 1004, communication chip 1006, and/or some other component of the computing device 1000 may be coupled with motherboard 1002 by way of the above-described MIS-BGA packages.

The computing device 1000 may be, for example, a mobile communication device or a desktop or rack-based computing device. The computing device 1000 may house a board such as a motherboard 1002. The motherboard 1002 may include a number of components, including (but not limited to) a processor 1004 and at least one communication chip 1006. Any of the components discussed herein with reference to the computing device 1000 may be arranged in or coupled with an MIS-BGA such as discussed herein. In further implementations, the communication chip 1006 may be part of the processor 1004.

The computing device 1000 may include a storage device 1008. In some embodiments, the storage device 1008 may include one or more solid state drives. Examples of storage devices that may be included in the storage device 1008 include volatile memory (e.g., dynamic random access memory (DRAM)), non-volatile memory (e.g., read-only memory, ROM), flash memory, and mass storage devices (such as hard disk drives, compact discs (CDs), digital versatile discs (DVDs), and so forth).

Depending on its applications, the computing device 1000 may include other components that may or may not be physically and electrically coupled to the motherboard 1002. These other components may include, but are not limited to, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

The communication chip 1006 and the antenna may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005

Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible broadband wide region (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1006 may operate in accordance with a Global System for Mobile Communications (GSM), General Packet Radio Service (GPRS), Universal Mobile Telecommunications System (UMTS), High Speed Packet Access (HSPA), Evolved HSPA (E-HSPA), or LTE network. The communication chip 1006 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1006 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1006 may operate in accordance with other wireless protocols in other embodiments.

The computing device 1000 may include a plurality of communication chips 1006. For instance, a first communication chip 1006 may be dedicated to shorter range wireless communications such as Wi-Fi and Bluetooth, and a second communication chip 1006 may be dedicated to longer range wireless communications such as GPS, EDGE, GPRS, CDMA, WiMAX, LTE, EV-DO, and others. In some embodiments, the communication chip 1006 may support wired communications. For example, the computing device 1000 may include one or more wired servers.

The processor 1004 and/or the communication chip 1006 of the computing device 1000 may include one or more dies or other components in an IC package. Such an IC package may be coupled with an interposer or another package using any of the techniques disclosed herein. The term "processor" may refer to any device or portion of a device that processes electronic data from registers and/or memory to transform that electronic data into other electronic data that may be stored in registers and/or memory.

In various implementations, the computing device 1000 may be a laptop, a netbook, a notebook, an ultra-book, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data. In some embodiments, the recessed conductive contacts disclosed herein may be implemented in a high-performance computing device.

The following paragraphs provide examples of various ones of the embodiments disclosed herein.

Example 1 may include a method comprising: providing, on a pad coupled with a carrier panel, a sacrificial element; providing, on the pad, a mold compound, wherein the mold compound is at least partially adjacent to the sacrificial element; and removing, subsequent to the providing of the mold compound, the sacrificial element to form a via in the mold compound to at least partially expose the pad.

Example 2 may include the method of example 1, wherein providing the mold compound includes providing the mold compound by way of compression molding.

Example 3 may include the method of example 1, wherein the removing includes thermally decomposing the sacrificial element.

Example 4 may include the method of example 3, wherein thermally decomposing the sacrificial element includes exposing the sacrificial element to a temperature sufficient to cause the sacrificial element to transition to a gas.

Example 5 may include the method of example 3, wherein thermally decomposing the sacrificial element includes exposing the sacrificial element to a temperature above 180° Celsius.

Example 6 may include the method of any of examples 1-5, wherein the pad is a first pad, the sacrificial element is a first sacrificial element, and the via is a first via, and further comprising: providing, on a second pad that is coupled with the carrier panel and adjacent to the first pad, a sacrificial element that is adjacent to the first sacrificial element; and removing the second sacrificial element to form a second via in the mold compound to at least partially expose the second pad.

Example 7 may include the method of any of examples 1-5, wherein the pad is less than 15 microns from a trace that is coupled with the carrier panel and separate from the pad.

Example 8 may include the method of example 7, wherein the trace has a width that is less than 15 microns as measured in a direction parallel to a face of the carrier panel that is coupled with the pad.

Example 9 may include the method of example 7, wherein the pad and the trace include copper.

Example 10 may include the method of any of examples 1-5, wherein the sacrificial element is a poly carbonate based polymer.

Example 11 may include the method of example 10, wherein the sacrificial element is Polynorborene based polymer.

Example 12 may include the method of any of examples 1-5, wherein the pad is a first pad, the sacrificial element is a first sacrificial element, the via is a first via, and the mold compound is a first mold compound, and further comprising: providing a second pad such that the first mold compound is at least partially between the second pad and the carrier panel; providing, on the second pad, a second sacrificial element; providing, on the second sacrificial element, a second mold compound wherein the second mold compound is at least partially adjacent to the second sacrificial element; and removing the second sacrificial element to form a second via in the second mold compound to at least partially expose the second pad.

Example 13 may include the method of example 12, further comprising: at least partially filling the first via with an electrically conductive material via a plating process; and providing the second pad at least partially on the electrically conductive material.

Example 14 may include the method of any of examples 1-5, wherein providing the sacrificial element includes stencil printing, photo defining, ink jet placing, spin-on coating, or dry etch patterning the sacrificial element on the pad.

Example 15 may include a package comprising: a pad; a trace that is separate from, and adjacent to, the pad such that the pad and the trace are less than 15 microns from each other; a mold compound at least partially disposed on the pad, and the trace; and a plated via coupled with the pad through the mold compound.

Example 16 may include the package of example 15, wherein the mold compound includes epoxy.

Example 17 may include the package of example 15, wherein the trace has a width of less than 15 microns as measured in a plane parallel to a face of the mold compound.

Example 18 may include the package of example 15, wherein the package is a mold interconnect system (MIS) ball grid array (BGA) package.

Example 19 may include the package of example 15, wherein the pad and the trace include copper.

Example 20 may include the package of any of examples 15-19, wherein the pad is a first pad and the plated via is a first plated via, and further comprising a second pad adjacent to the trace such that the trace is positioned between the first pad and the second pad, and the trace is less than 15 microns from the second pad.

What is claimed is:

1. A method comprising:
    providing, on a first pad coupled with a carrier panel, a first sacrificial element;
    providing, on the first pad, a first mold compound, wherein the first mold compound is at least partially adjacent to the first sacrificial element;
    removing, subsequent to the providing of the first mold compound, the first sacrificial element to form a first via in the first mold compound to at least partially expose the first pad;
    providing a second pad such that the first mold compound is at least partially between the second pad and the carrier panel;
    providing, on the second pad, a second sacrificial element;
    providing, on the second sacrificial element, a second mold compound wherein the second mold compound is at least partially adjacent to the second sacrificial element; and
    removing the second sacrificial element to form a second via in the second mold compound to at least partially expose the second pad.

2. The method of claim 1, wherein providing the first mold compound includes providing the first mold compound by way of compression molding.

3. The method of claim 1, wherein the removing includes thermally decomposing the first sacrificial element.

4. The method of claim 3, wherein thermally decomposing the first sacrificial element includes exposing the sacrificial element to a temperature sufficient to cause the first sacrificial element to transition to a gas.

5. The method of claim 3, wherein thermally decomposing the first sacrificial element includes exposing the sacrificial element to a temperature above 180° Celsius.

6. The method of claim 1, wherein the second sacrificial element is adjacent to the first sacrificial element.

7. The method of claim 1, wherein the first pad is less than 15 microns from a trace that is coupled with the carrier panel and separate from the first pad.

8. The method of claim 7, wherein the trace has a width that is less than 15 microns as measured in a direction parallel to a face of the carrier panel that is coupled with the first pad.

9. The method of claim 7, wherein the first pad and the trace include copper.

10. The method of claim 1, wherein the first sacrificial element is a poly carbonate based polymer.

11. The method of claim 10, wherein the first sacrificial element is Polynorborene based polymer.

12. The method of claim 1, further comprising:
    at least partially filling the first via with an electrically conductive material via a plating process; and
    providing the second pad at least partially on the electrically conductive material.

13. The method of claim 1, wherein providing the first sacrificial element includes stencil printing, photo defining, ink jet placing, spin-on coating, or dry etch patterning the first sacrificial element on the pad.

* * * * *